United States Patent [19]

Adams

[11] Patent Number: 4,580,039

[45] Date of Patent: Apr. 1, 1986

[54] CIRCUIT ARRANGEMENT FOR THE PROTECTION OF DATA IN VOLATILE WRITE-READ MEMORIES (RAM)

[75] Inventor: Jürgen Adams, Villingen-Schwenningen, Fed. Rep. of Germany

[73] Assignee: Kienzle Apparate GmbH, Villingen-Schwenningen, Fed. Rep. of Germany

[21] Appl. No.: 461,028

[22] Filed: Jan. 26, 1983

[30] Foreign Application Priority Data

Jan. 28, 1982 [DE] Fed. Rep. of Germany ..... 82100587

[51] Int. Cl.⁴ ............................................. G07B 15/00
[52] U.S. Cl. ..................................... 235/30 R; 235/45
[58] Field of Search ............. 364/200, 900; 235/30 R, 235/45

[56] References Cited

U.S. PATENT DOCUMENTS 4,328,558 5/1982 Musa et al. ........................... 364/900
4,332,009 5/1982 Gerson ................................. 364/200

Primary Examiner—Gareth D. Shaw
Assistant Examiner—John G. Mills
Attorney, Agent, or Firm—Toren, McGeady, Stanger, Goldberg & Kiel

[57] ABSTRACT

A circuit arrangement for the permanent protection of data in volatile write-read memories (RAM) such as the type used for the storage of tariff data and variable control counter data in a taximeter. The inventive circuit arrangement provides a signal line between the microcomputer system and a volatile write-read memory (RAM) via a control circuit. By means of this arrangement, in the sealed state of the taximeter, a permanently effective suppression of write instructions can be set. Thus, the data stored there can no longer be affected by any interference signals from the microcomputer system. The supply of operating voltage of the RAM is secured by means of a circuit which includes a buffer battery and a buffer capacitor.

8 Claims, 2 Drawing Figures

CIRCUIT ARRANGEMENT FOR THE PROTECTION OF DATA IN VOLATILE WRITE-READ MEMORIES (RAM)

FIELD OF THE INVENTION

The invention relates to a circuit arrangement for the protection of data, particularly tariff data and variable control data, in write-read memories (RAM) which are constructed as volatile memories, in interaction with a microcomputer system of a taximeter which is protected by means of buffer elements against supply voltage breakdowns. This circuit arrangement is intended to protect against manipulation and loss or unauthorized modification of the stored information.

BACKGROUND OF THE INVENTION

The microcomputer system of a taximeter consists essentially of an arrangement of a microprocessor with memories, input-output elements and supply modules which are combined as a system and which can decide, compute, display and store data by means of a predeterminable program based on the input of distance and/or time signals. A much-accepted type is the MOS microprocessor (for instance Intel 8049) which works, for instance, with an eight bit word length compared to the bipolar embodiments. As a part of the microcomputer system, the microprocessor or CPU serves for the processing of data according to a predeterminable rule. The directions for the latter are stored in a read-only memory or ROM as thus identified instructions and they represent the internal working program of the system. Information is fed one time into the read-only memory (ROM) and remains there permanently. The function of the ROM is limited so that the memory content can be read out. In the case of this application, the ROM serves primarily for program storage. However, during each change of information, the ROM must be exchanged for a new ROM which is programmed with correspondingly changed data. In the case of taximeters, the tariff data which form the basis for calculation of a fare are also subject to such changes. In known taximeters, one supplied the changed tariff data into a separate, exchangeable, programmable ROM (PROM) and, at the appropriate point in time when the new tariff became effective, it was exchanged for the present module (PROM). Of course, considerable effort is expended in this mode of operation when the tariff changes frequently.

In addition, a write-read memory (RAM) for the processing of variable data is provided in the microcomputer system. Since information can be read in the RAM and again read out at random in an advantageous manner, this type of memory is extremely suitable for the storage of data or the intermediate storage of data, however, care must be taken that the feed voltage is not lost because the information may be falsified or may be lost due to a voltage breakdown.

It is therefore absolutely necessary in the storage of information in write-read memories (RAM) which are constructed as volatile memories, to provide suitable measures which activate a protective device in dependence on power supply failures or the decrease of supply voltages below a predetermined value and these protective devices guarantee that the information remains in the RAM.

A known circuit arrangement for bridging power supply failures consists in that, for instance, a buffer battery is assigned to the RAM area which saves the stored information temporarily. However, it has been found that, in addition, for instance during power supply failure, due to capacities or inductances in the computer system or the power supply part, undefined voltage conditions result which may falsify information stored in the write-read memory (RAM). In addition to protecting the supply voltage for the RAM area by means of a buffer battery, also for protection of the information in the RAM, an additional measure is necessary which prevents all undefined voltage pulses which result during power supply failure in the system and which may act as interference pulses from affecting the RAM area.

In this connection, according to the German Patent No. 28 03 202, a circuit arrangement for the protection of data during power supply failure or decreasing supply voltage is specified for information stored in write-read memories (RAM) which are constructed as volatile memories. As measures for protection of information in the RAM during voltage failure or decrease of the supply voltage below a minimum value, a voltage monitoring circuit is provided which, in the case of protection, i.e., only during voltage decrease, takes over the supply of the RAM area with operating voltage from a charge storage or long-term storage of a decoupling network. The decoupling network then also controls a RAM write blocking circuit whereby any change of information in the RAM area is prevented before any interference pulses are present. In summary, this known device serves exclusively for protection of information in the RAM during voltage failure of the computer system.

During the normal operation of a system, i.e., during correct operating voltage conditions, the known system does not offer adequate protection, for instance, for tariff data and/or control data in an RAM of a taximeter since, due to any system interferences or manipulations, it would be conceivable to feed erroneous information into the RAM.

It is an object of the invention to provide a circuit arrangement for the permanent protection of data, particularly of tariff data and control data, in a volatile write-read memory (RAM) of a taximeter, wherein the measures for protection can only be cancelled by means of an authorized action in the circuit arrangement.

SUMMARY OF THE INVENTION

The object of the invention, referred to above, is achieved according to the invention by means of a control circuit which is incorporated in the signal line between the microcomputer system and the write-read memory (RAM). By means of this control circuit, in the calibrated state of the system, a suppression of write instructions can be set in such a way that maintenance of the stored data in the RAM is guaranteed.

The advantages of using a write-read memory (RAM) which is constructed as a volatile memory can generally not be overlooked for data storage. The advantages lie particularly in the characteristic of the RAM memory which makes available, on a relatively economical basis with this component, a storage means into which, in a simple manner, information may be read in and read out as often as desired. This ability is very convenient in the application in a taximeter in the characteristic as a tariff data and control data storage. Since, however, RAM's as storage means are in connection with all data, address and control lines with a microprocessor system, it must be ensured by means of additional circuit measures that unintentional information from the system cannot cause a change in the stored data in the RAM due to a case of interference as well as due to attempted manipulation. With the control which is incorporated in the write-signal line between the microcomputer system and the RAM, a total or partial preselectable suppression of write instructions can be set. By means of the circuit arrangement for the prevention of the recording possibility of the RAM, for instance, for tariff data and with a simultaneously effective decoupling of the operating voltage of the system and buffering of the supply voltage of the RAM during normal operating condition of a taximeter, it is achieved without great expenditure that the data stored in the RAM cannot be influenced by any uncontrolled interferences. During a simultaneous use of the RAM for feeding in tariff data and variable control counter data, the control circuit has measures by means of which parts of the RAM, for instance those parts characterized by a special address range, can be blocked against recording of information, so that a data interrogation can always be triggered, but any action in the sense of a data modification remains without effect for the characterized part of the memory. Due to the measure of a controlled prevention of the possibility to write in the RAM, it is possible during normal operation of a taximeter to absolutely protect the content of information of the memory which is volatile per se.

In order to finally utilize the characteristic of reading in information into the RAM in an advantageous manner, particularly in connection with a change of tariff data, the switching element for prevention of a write effect consists, for instance, of a sealable switch by means of which, during normal operation of the taximeter, the write signal can be blocked, however, it can be released for a programming operation. The latter process is limited, for instance, to an input of new or changed tariff data which may only be performed by a group of persons with the authority for this task. Due to the possibility to change the tariff data by means of suitable switching elements in the control circuit, tariff changes can be performed as often as desired without any expenditure for new parts. To release the write-blocking circuit for a required change in the tariff data, also a code switching mechanism may be used. Finally, instead of the code switching mechanism, suitable optically or magnetically acting devices may be used in order to guarantee an effect on the control circuit in the case of a required change in the tariff data.

For a better understanding of the present invention, reference is made to the following description and accompanying drawings, while the scope of the present invention will be pointed out in the appended claims.

DESCRIPTION OF THE PREFERRED EMBODIMENTS

Figure 1:
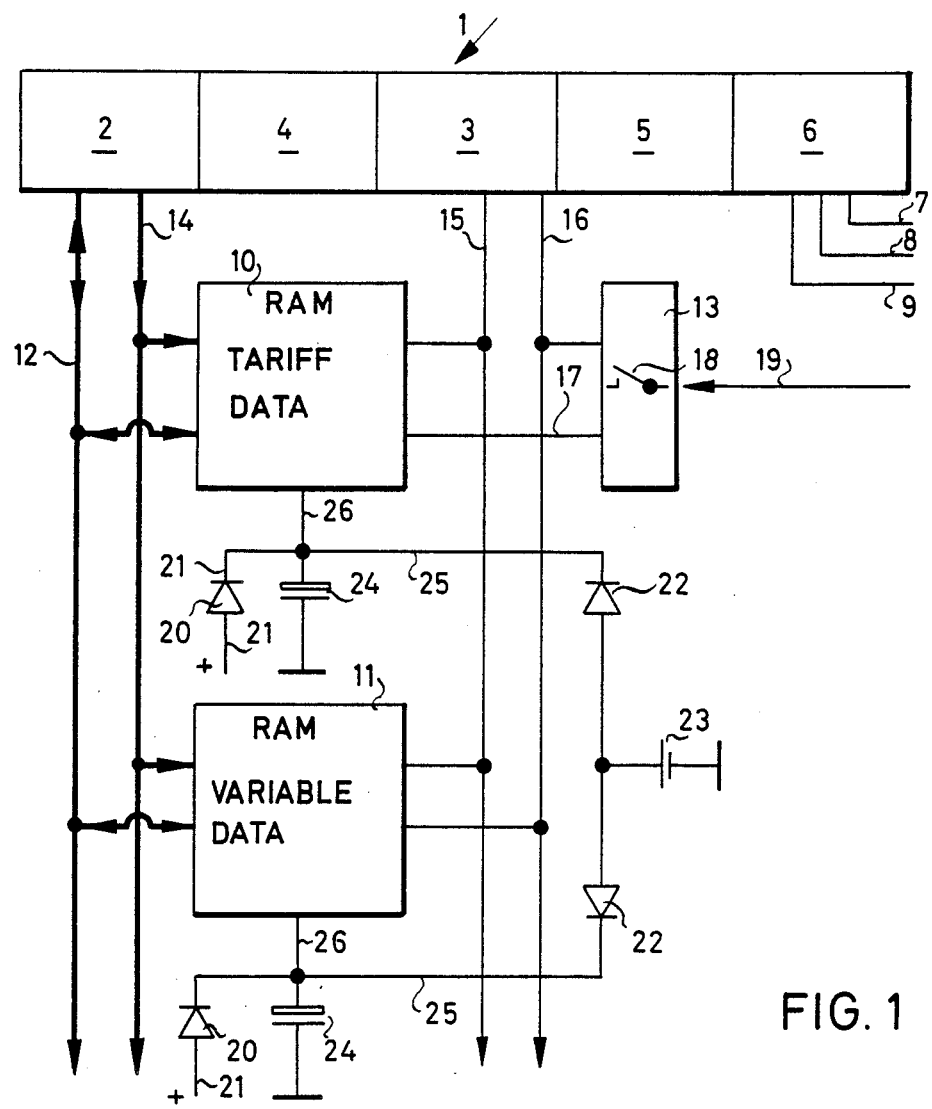
FIG. 1 shows a schematic circuit arrangement with a microcomputer system for taximeters including a circuit device for the protection of tariff data in a volatile memory (RAM)

The invention is directed to storage of tariff and control data in an electronic taximeter and the protection of these data against unauthorized changes caused by system interferences or attempted manipulation. An electronic taximeter is essentially comprised of a microcomputer system 1 which is usually a combination of a microprocessor 2 or CPU (central processor unit), a program memory or ROM3 (read-only memory), a write-read memory 4 or RAM (random access memory), a control unit 5 or bus control and a clock generator 6 or clock. Depending on the functional importance and the structural interconnections of the device, the required components are combined to component groups and are arranged according to their hardware on appropriately designed, printed circuit boards. These printed circuit boards can be connected with one another by means of suitable plug connections whereby simultaneously, if possible, all necessary conducting lines between the component groups are established. A further description of all component groups is not necessary for the explanation for the connections of the circuit arrangement according to the invention and for this reason they are only indicated generally.

Functional decisions, calculating processes, control processes, storage of data, etc., are handled in an electronic taximeter in the component group which is to be identified with the term "logic". The core of the logic is, as shown in FIG. 1, the microcomputer system 1 with the central microprocessor 2 or CPU as the component which performs the functional sequences. For supply with operating voltage, the microcomputer system 2 is connected by means of a line 7 with a power supply which is adapted to the requirements, but not further shown. For representation of the processes, particularly for the continuous display of results, storage data, control counter data and other information which is important for the operation of the taximeter, the corresponding called-up data are shown by means of a display bus 8 in a multiple display field which is arranged in accordance with the importance of the data. Finally, the microcomputer system 1 receives via a generator signal line 9 by means of appropriately prepared signals from a generator input circuit which are evaluated, for instance, as distance units for conversion to fare units, using predetermined computation rules in the logic. As is known, in addition to distance units, time units are also included in the computation of a fare unit. The decision which of the two units are included in the form of a signal course, or whether both signal frequencies are included in a specific relation to one another for the determination of the fare, is made by the logic based on a working program which is determined by the corresponding tariff structure.

As is also known, the basis for a fare unit is the tariff which is established for local conditions. Due to this requirement and also due to the continuous adaptation of the fares to the continuously rising expenses, the taximeter or the hardware areas must be adaptable to any specified tariff situation.

Figure 2:
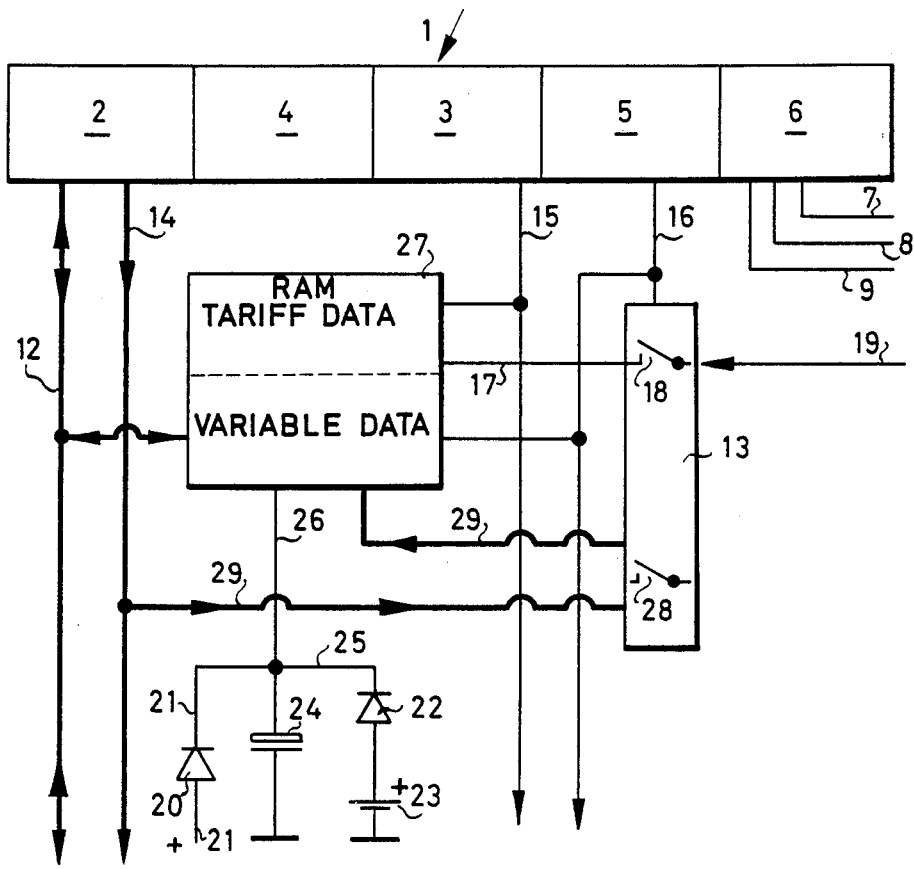
FIG. 2 shows a schematic circuit arrangement according to FIG. 1 including a circuit device for the protection of tariff data, stored in a specific address range of a volatile memory (RAM).

The memory module which is on the market as a volatile write-read memory 10 or RAM has proven to be particularly suitable for storage of tariff data as well as repeated changes of these data at certain intervals as long as one is successful in achieving an absolute protection of the tariff data, stored in the RAM. A protective measure must be directed to the ordinary case of interference, such as system interferences or power supply failures, as well as also to the attempted case of interference due to manipulation of the stored data during normal operation of the taximeter. The RAM 10 is functional as a tariff data storage, separately from the central microcomputer system 1, as shown in FIGS. 1 and 2, and is connected with all data, address and control lines to the microcomputer system 1. According to the embodiment of FIG. 1, for the storage of tariff data, a separate RAM 10 is provided; correspondingly, in order to hold continuously variable data, such as, for instance, the control counter data, a RAM 11 is arranged. By means of a bidirectional counter data bus 12 controlled by the control mechanism in the microcomputer system 1, the flow of data takes place between the microcomputer system 1 and the called-up memory RAM 10 or 11.

While the RAM 11 can be switched during normal operation of the taximeter by means of control signals from the microcomputer area 1 selectively according to the operating program to write or read processes, the function of the RAM 10 remains limited to merely making available the stored tariff data for the read-out process. In the exceptional case, i.e., in the case of an intentional change of the tariff data, also the RAM 10 can be set by actuating a control circuit 13 which is still to be explained below for a write process.

For the selection of the data to be read out or for feeding in of data to be stored, the RAM 10 and 11 are connected by means of an address bus 14 with the microcomputer system 1. Corresponding signals for reading or writing are conducted into the RAM 10 by means of the internal control unit 5 or the control bus and a read-signal line 15 as well as a write signal line 16. For the transfer of a write-signal into the RAM 10 which is intended exclusively for tariff data, the write-signal line 16 is connected by means of a control circuit 13 and a write-connecting line 17 with the RAM 10. Due to the control circuit 13, it is possible, by means of additional switching elements in the control circuit 13, to let an intentional write-signal reach the RAM 10 exclusively by means of influencing the control circuit 13 separately from the system. Due to the interconnection of the control circuit 13, for the normal operation of a taximeter, a permanent suppression of the write instruction, which in its simplest form is represented as a write pulse on a signal line 16 to the RAM 10, can be set. In this way, it is absolutely prevented that the system can change the data stored as tariff data in the RAM 10 in any manner.

To restrict the influence on the control circuit 13 to an authorized circle of personnel, the control circuit 13 has, for instance, a sealable switch 18 which interrupts a write signal for the RAM 10 or generates a blocking signal by means of which any flow of information into the RAM 10 is prevented. In order to make it more difficult to influence the control circuit 13, also a code switching mechanism may be provided by means of which a switch 18 to produce the connection of the write-signal line with the RAM 10 can be controlled. In another embodiment, it is conceivable to influence the control circuit 13 by means of an optical device in order to make possible to write in the tariff RAM 10 with new tariff data. In another embodiment of the control circuit 13, the tariff RAM 10 can also be charged by means of magnetic control elements and the use of Reed switches. The different specified types of external action on the control circuit 13 in the sense of a specified tariff data change are indicated according to FIGS. 1 and 2 by a line 19.

For storage of the variable control data, according to the embodiment of FIG. 1, an additional write-read memory (RAM) 11 is provided which for read-in and read-out of data is also connected by means of the data bus 12 and the address bus 14 with the microcomputer system 1. In a storage of variable control data, for a continuous modification of the memory contents, the write-signal line 16 and the read-signal line 15 are connected directly with the bus control unit 5. To supply the RAM 10 and 11 with operating voltage, for protection of the voltage supply and for protection against any operating voltage breakdowns, one decoupling diode 20 is always provided in the line 21 to the operating voltage source of the system. An additional decoupling diode 22 is always in the voltage supply line from a buffer battery 23, shown in FIG. 1. Finally, the circuit arrangement contains, for decoupling and buffering of the supply voltage, a buffer capacitor 24 which is connected on the one side to ground and with its second connection is connected with the voltage supply lines 21 and 25 as well as by means of a line 26 with the RAM 10 and 11 for continuous supply and maintenance of the memories with operating voltage.

In another embodiment of the circuit arrangement according to the invention, for the mutual storage of tariff data and variable data (for instance, control counter data), one single write-read memory (RAM) module 27 is used (FIG. 2). The RAM 27 is divided into correspondingly required storage areas for fulfillment of the storage tasks of secured tariff data, on the one hand, and variable control counter data, on the other hand. In order to also here achieve to the same extent the absolute protection of the tariff data against unauthorized changes, the control circuit 13 is expanded in that additional switching elements 28 are provided by means of which specific address areas in the RAM which are assigned to the storage of tariff data can be blocked for incorrect writing. For this purpose, the address bus 14 is guided with respect to the signal lines 29 for the memory address for tariff data over the control circuit 13 where appropriate memory areas can be addressed by means of the switching element 29. In the memory sector which can be blocked by means of the switching element 28, in the sealed state of the taximeter, the storage areas are readable but not writable. Accordingly, in interaction with the write-signal block which is arranged in the same control circuit 13, the tariff data stored there cannot be changed. As already explained in connection with FIG. 1, a change can be only undertaken by authorized persons by externally acting by influencing a line 19. Regarding the safety measures against falsification of the contents of information of the RAM 27 based on a voltage breakdown or loss, the same measures apply for the circuit arrangement according to FIG. 2, as were explained for the circuit according to FIG. 1.

While the foregoing description and drawings represent the preferred embodiments of the present invention, it will be obvious to those skilled in the art that various changes and modifications may be made therein without departing from the true spirit and scope of the present invention.

What is claimed is:

1. In a circuit arrangement for the protection of data, particularly of tariff data and/or variable control data, in write-read memories (RAM) which are constructed as volatile memories, in interaction with a microcomputer system of a taximeter, protected by means of buffer elements against supply voltage breakdowns against manipulation and loss or unauthorized modification of the stored information, the improvement comprising a control circuit which is included in the signal line between said microcomputer system and said write-read memory (RAM), said control circuit, in the calibrated state of the taximeter, having means for suppression of write instructions so that maintenance of the stored data in said RAM is guaranteed despite supply voltage breakdowns or unauthorized modification.

2. A circuit arrangement according to claim 1, wherein said control circuit between said microcomputer system and said write-read memory (RAM) includes means in the sealed state for preventing the possibility of writing in said RAM memory in a specific address range by settable switching means.

3. A circuit arrangement according to claim 1 or 2, wherein a circuit for decoupling of the operating voltage of said microcomputer system from said write-read memory (RAM) and the switching element is provided for buffering of an operating voltage for said RAM in such a way that, in the normal operating state of the device, changes in the operating voltage of said microcomputer system remain permanently without influence on the stored information of said RAM.

4. A circuit arrangement according to claim 1, wherein, in order to provide an operating voltage for said RAM memory for tariff data and variable data, a buffer battery, buffer capacitor and decoupling diode are provided, said buffer battery charging said buffer capacitor by means of said decoupling diode.

5. A circuit arrangement according to claim 1, wherein said control circuit includes settable switch means by which specifiable signals, intended for the protected functional position for the operation of the taximeter, can be conducted from said microcomputer systems into said RAM and a data call-up of all stored information can be initiated for operation of the taximeter from said RAM and a change of the stored tariff data can be permanently blocked by appropriately settable write suppresssion means.

6. A circuit arrangement according to claim 2, wherein said switching means in said control circuit, with which a suppression of write instructions for specific address ranges of a RAM which can be charged with constant tariff data and variable control counter data, can be set.

7. A circuit arrangement according to claim 2 or 5, wherein said switching means are sealable and with which control and/or blocking signals for suppression of write instructions and a blockage of address lines for the area of a tariff data memory in a memory portion can be initiated.

8. A circuit arrangement according to claim 2 or 5, wherein said control circuit contains a code switching mechanism by means of which a signal for control of said switching means can be initiated.

* * * * *